United States Patent
Cohen

(10) Patent No.: US 9,911,614 B2
(45) Date of Patent: Mar. 6, 2018

(54) METHODS FOR ACTIVATING OPENINGS FOR JETS ELECTROPLATING

(76) Inventor: Uri Cohen, Palo Alto, CA (US)

(*) Notice: Subject to any disclaimer, the term of this patent is extended or adjusted under 35 U.S.C. 154(b) by 726 days.

(21) Appl. No.: 12/814,439

(22) Filed: Jun. 12, 2010

(65) Prior Publication Data

US 2010/0243462 A1 Sep. 30, 2010

Related U.S. Application Data

(63) Continuation of application No. 10/688,333, filed on Oct. 17, 2003, now abandoned.

(60) Provisional application No. 60/423,932, filed on Nov. 5, 2002, provisional application No. 60/423,934, filed on Nov. 5, 2002.

(51) Int. Cl.
| | |
|---|---|
| *H01L 21/288* | (2006.01) |
| *C25D 7/12* | (2006.01) |
| *H01L 21/768* | (2006.01) |
| *C25D 5/08* | (2006.01) |
| *C25D 5/20* | (2006.01) |

(52) U.S. Cl.
CPC .............. *H01L 21/288* (2013.01); *C25D 5/08* (2013.01); *C25D 5/20* (2013.01); *C25D 7/123* (2013.01); *H01L 21/2885* (2013.01); *H01L 21/76879* (2013.01)

(58) Field of Classification Search
CPC ............. H01L 21/288; H01L 21/76879; H01L 21/2885; C25D 7/123; C25D 5/08; C25D 5/20
USPC ................................................ 205/133, 148
See application file for complete search history.

(56) References Cited

U.S. PATENT DOCUMENTS

| | | | |
|---|---|---|---|
| 3,652,442 A | 3/1972 | Powers et al. | 204/273 |
| 3,715,299 A | 2/1973 | Anderson et al. | 204/212 |
| 3,743,590 A | 7/1973 | Roll | 204/212 |
| 3,893,869 A | 7/1975 | Mayer et al. | 134/86 |
| 3,933,601 A | 1/1976 | Ishibashi et al. | 204/25 |
| 3,963,588 A | 6/1976 | Glenn | 204/16 |
| 4,102,756 A | 7/1978 | Castellani et al. | 204/43 T |
| 4,267,024 A | 5/1981 | Weiskopf | 204/15 |
| 4,304,641 A | 12/1981 | Grandia et al. | 204/23 |
| 4,359,375 A | 11/1982 | Smith | 204/212 |
| 4,364,801 A | 12/1982 | Salama | 204/15 |

(Continued)

OTHER PUBLICATIONS

"Copper Electrodeposition Studies with a reciprocating Paddle" by D. E. Rice et al., in Journal of the Electrochemical Society, vol. 135(11), pp. 2777-2780, Nov. 1988.

(Continued)

*Primary Examiner* — Louis J Rufo

(57) ABSTRACT

One embodiment of the present invention one embodiment of the present invention is a method for electrofilling a metal or alloy inside at least one opening surrounded by a field on a front surface of a substrate, wherein at least one surface inside the at least one opening includes an exposed metallic surface, said method including steps of: (a) immersing the substrate in an activation or wetting solution; (b) applying ultrasonic or megasonic vibrations to the substrate; and, after commencing applying ultrasonic or megasonic vibrations to the substrate, (c) applying high pressure jets of an electrolyte to the substrate, said electrolyte includes metallic ions of said metal or alloy; and (d) applying an electroplating current to the substrate to electroplate said metal or alloy inside the at least one opening.

15 Claims, 7 Drawing Sheets

(56) References Cited

U.S. PATENT DOCUMENTS

| | | |
|---|---|---|
| 4,771,111 A | 9/1988 | Tieke et al. ............... 525/182 |
| 4,834,842 A | 5/1989 | Langner et al. ............... 204/1 |
| 4,956,999 A * | 9/1990 | Bohannan et al. ............ 73/587 |
| 5,368,634 A | 11/1994 | Hackett ....................... 95/260 |
| 5,421,987 A | 6/1995 | Tzanavaras ................. 205/133 |
| 5,427,622 A | 6/1995 | Stanasolovich et al. ......... 134/1 |
| 5,533,540 A | 7/1996 | Stanasolovich et al. ....... 134/15 |
| 5,544,773 A | 8/1996 | Haruta et al. ................. 216/13 |
| 5,849,091 A | 12/1998 | Skrovan et al. ................. 134/1 |
| 5,883,762 A | 3/1999 | Calhoun et al. ............ 360/113 |
| 5,904,827 A | 5/1999 | Reynolds ..................... 205/68 |
| 6,071,809 A | 6/2000 | Zhao ........................... 438/634 |
| 6,080,291 A | 6/2000 | Woodrruff et al. ...... 204/297.01 |
| 6,176,992 B1 | 1/2001 | Talieh ........................... 205/87 |
| 6,179,983 B1 | 1/2001 | Reid et al. ..................... 205/96 |
| 6,224,737 B1 | 5/2001 | Tsai et al. ................... 205/123 |
| 6,228,232 B1 | 5/2001 | Woodruff et al. ........... 204/242 |
| 6,258,220 B1 | 7/2001 | Dordi et al. ................. 204/198 |
| 6,280,641 B1 | 8/2001 | Gaku et al. ................... 216/17 |
| 6,333,560 B1 | 12/2001 | Uzoh ........................... 257/774 |
| 6,334,937 B1 | 1/2002 | Batz et al. ................... 204/212 |
| 6,344,129 B1 | 2/2002 | Rodbell et al. .............. 205/291 |
| 6,399,479 B1 | 6/2002 | Chen et al. .................. 438/628 |
| 6,416,647 B1 | 7/2002 | Dordi et al. ................. 205/137 |
| 6,423,200 B1 | 7/2002 | Hymes ......................... 205/123 |
| 6,432,821 B1 | 8/2002 | Dubin et al. ................. 438/678 |
| 6,534,116 B2 | 3/2003 | Basol ........................... 427/97 |
| 6,547,937 B1 | 4/2003 | Oberlitner et al. ....... 204/224 R |
| 6,773,559 B2 | 8/2004 | Woodruff et al. ............ 204/222 |
| 6,790,776 B2 | 9/2004 | Ding et al. ................... 438/685 |
| 7,294,244 B2 | 11/2007 | Oberlitner et al. ........... 204/273 |
| 2002/0000383 A1 | 1/2002 | Lee ............................... 205/122 |
| 2002/0020621 A1 | 2/2002 | Uzoh et al. .................. 204/212 |
| 2002/0092772 A1* | 7/2002 | Ding et al. ................... 205/186 |
| 2002/0189637 A1 | 12/2002 | Downes et al. .............. 134/1.3 |
| 2003/0064586 A1* | 4/2003 | Merchant et al. ............ 438/678 |
| 2003/0205238 A1 | 11/2003 | Bran ............................. 134/1.3 |
| 2004/0118697 A1* | 6/2004 | Wen+ et al. .................. 205/215 |

OTHER PUBLICATIONS

"Damascene Copper Electroplating for Chip Interconnections" by P. C. Andricacos et al., in IBM Journal of Res. and Develop., vol. 42, No. 5, Sep. 1998, pp. 567-574.
"Copper On-Chip Interconnections" by P. C. Andricacos in the Electrochemical Society INTERFACE, pp. 32-37, Spring 1999.
"Factors Influencing Damascene Feature Fill Using Copper PVD and Electroplating" by J. Reid et al., in Journal of Solid State Technology, vol. 43(7), pp. 86-103, Jul. 2000.
"Superconformal Electrodeposition of Copper in 500-90 nm Features" by T. P. Moffat et al, in Journal of The Electrochemical Society, vol. 147(12), pp. 4524-4535, Dec. 2000.
A. R. Despic and K. I. Popov, "Transport-Controlled Deposition and Dissolution of Metals", in Modern Aspect of Electrochemistry, vol. 7, Edited by B. E. Conway and J. O'M. Bockris, pp. 256-268, Plenum Press, N.Y. 1972.
E. H. Lyons, "Fundamental Principles", in Modern Electroplating, $3^{rd}$ Edition, edited by F. A. Lowenheim, pp. 31-36, John Wiley & Sons, 1974.
J. Jorne, Challenges in Copper Interconnect Technology: Macro-Uniformity and Micro-Filling Power in Copper Electroplating of Wafers, in Semiconductor Fabtech—$11^{th}$ Edition, pp. 267-271, Feb. 2000.
U. Cohen and G. Tzanavaras, "Seed Layers and Cu Jets Plating for Interconnects Below 0.10 Micron", in the $17^{th}$ VLSI Multilevel Interconncetion Conference (VMIC), pp. 21-26, Santa Clara, California, Jun. 2000.
M. Matlosz, "Competitive Adsorption Effects in the Electrodeposition of Iron-Nickel Alloys", J. Electrochem. Soc. vol. 140(8), Aug. 1993, pp. 2272-2279.
P. C. Andricacos et al., "Electrodeposition of Nickel-Iron Alloys", J. Electrochem. Soc. vol. 136(5), May 1989, pp. 1336-1340.
U. Cohen et al., "Silicon Epitaxial Growth by Electrodeposition from Molten Salts", Journal of The Electrochemical Society, vol. 123(3), pp. 381-383, Mar. 1976.
"Before the Board of Patent Appeals and Interferences", Decision on Appeal, US Patent and Trademark Office, Ex Parte Uri Cohen, Appeal 2009-001403, U.S. Appl. No. 10/688,333, Decided: Apr. 30, 2010.
"Ultrasonic and Megasonic Particle Removal" by A. A. Busnaina and G. W. Gale, in Precision Cleaning '95 Proceedings (1995), pp. 347-360.
"Removal of Particulate Contaminanrs Using Ultrasonics and Megasonics: A Review", by G. W. Gale and A. A. Busnaina, in Particulate Science and Technology, 13:197-211 (1995), p. 197.
U.S. Appl. No. 09/245,780, abandoned, Dordi et al.
T. Kessler and R. Alkire, "A Model for Copper Electroplating of Multilayer Printed Wiring Boards", J. Electrochem. Soc., vol. 123(7), Jul. 1976, pp. 990-999.
Chiu et al., "Characterization of additive systems for damascene Cu electroplating by the superfilling profile monitor", Journal of Vacuum Science & Technology B, Nov./Dec. 2000, vol. 18, pp. 2835-2841.
Jordan et al., "The Effect of Inhibitor Transport on Leveling in Electrodeposition", Journal of the Electrochem. Soc., vol. 138(5), May 1991, pp. 1251-1259.
Takahashi et al., "Transport Phenomena That Control Electroplated Copper Filling of Submicron Vias and Trenches", Journal of the Eelectrochem. Soc., vol. 146(12), Dec. 1999, pp. 4499-4503.
A. A. Sonin, "Jet Impingement Systems for Electroplating Applications: Mass Transfer Correlations", J. Electrochem. Soc., vol. 130(7), Jul. 1983, pp. 1501-1505.
D. T. Schwartz et al., "Mass-Transfer Studies in a Plating Cell with a Reciprocating Paddle", J. Electrochem. Soc., vol. 134(7), Jul. 1987, pp. 1639-1645.
G. Ritter et al., "Two- and three-dimensional numerical modeling of copper electroplating for advanced ULSI metallization", Solid-State Electronics, vol. 44 (2000), pp. 797-807.
M. Data et al., "Fundamental aspects and applications of electrochemical Microfabrication", Electrochimica Acta, vol. 45 (2000), pp. 2535-2558.

* cited by examiner

METHODS FOR ACTIVATING OPENINGS FOR JETS ELECTROPLATING

This application is a continuation of application Ser. No. 10/688,333, filed on Oct. 17, 2003, which application claims the benefit of U.S. Provisional Application Nos. 60/423,932 (filed on Nov. 5, 2002) and 60/423,934 (filed on Nov. 5, 2002), both of which are incorporated herein by reference.

TECHNICAL FIELD OF THE INVENTION

One or more embodiments of the present invention relate to activating and wetting openings for filling, and one or more embodiments of the present invention relate to jets electrochemical deposition ("JECD") of metals and alloys.

BACKGROUND OF THE INVENTION

The following describes two prior art methods for filling patterned openings by electroplating (electrofilling). In accordance with one prior art method, an insulating mask such as an oxide, photoresist, or polyimide layer is patterned over a conductive metallic surface or a "seed layer" (or "plating base"), exposing only the metallic surface at the bottom of the openings. Electroplating is carried out through the openings in the insulating mask, and is confined inside the openings of the mask (for as long as the deposit thickness does not exceed the openings depth). Usually, following the electroplating, the insulating mask is removed, and the unplated seed layer (which was covered by the insulating mask during electroplating) is etched away. This prior art method is often used in fabricating, for example, coils and magnetic poles and other metallic structures of thin film heads, metallic conductors in high density packages (such as flip-chips, chip-scale packaging, and wafer-scale packaging), and in MEMS devices.

In accordance with a second prior art method, sometimes referred to as Damascene or Dual Damascene (DD), an insulating (or dielectric) layer is first pattern-etched to form openings therein. Next, at least one metallic layer is deposited over the insulating layer to metallize its top surface (sometimes referred to as a field), as well as the sidewalls and bottom surfaces of the openings. The metallic layer(s) serves as a conductive plating seed (or plating base) layer, to provide a low resistive electric path for the electroplating current. Electroplating is then carried out over the entire metallized surface, including the field and inside the patterned openings. Following electroplating, the plated metal and any metallization (adhesion, barrier, or seed) layers above the field, as well as any excess plated metal over the openings, are removed by etching, polishing, or by chemical mechanical polishing (CMP). This results in metallic filled vias or trenches (or grooves), embedded in (or surrounded by) a dielectric. This prior art method is used, for example, to produce metallic interconnects in semiconductor integrated circuits devices.

Electroplating often requires a high degree of plated metal thickness uniformity and, in the case of alloy plating, composition uniformity. Uniformity is typically further defined as macro-uniformity (i.e., uniformity over relatively large dimensions of about 1 cm, or larger, such as across a wafer), and micro-uniformity (i.e., uniformity over small dimensions of a few millimeters, or smaller, such as across an individual micro-device or a die). When electroplating an alloy through a patterned mask, such as a photoresist mask, composition non-uniformity is often encountered among opening areas of different aspect ratios. Such micro-non-uniformity is due to insufficient agitation and replenishment of the minor constituent(s) inside deep and narrow opening areas. An example of where such a situation may occur is in electroplating of Ni—Fe (permalloy) through a patterned photoresist mask in the course of manufacturing Thin Film Heads (TFH) or Magnetic Bubbles. In this example, $Fe^{+2}$ ion concentration in the electrolyte is very low compared with $Ni^{+2}$ ion concentration, i.e., a ratio between the two ($Fe^{+2}/Ni^{+2}$) is typically only about 0.015-0.030. In contrast, the composition ratio between Fe and Ni in the deposited permalloy (80% Ni and 20% Fe) is about 0.25. In general, uniformities degrade with increasing substrate dimensions and with decreasing feature size. Larger wafers and smaller devices increase the number of devices per wafer, thereby reducing the processing cost per device. Macro-non-uniformity of the current distribution across a wafer, such as due to radial voltage-drop distribution ("terminal effect"), or edge or corner effects, leads to both thickness and composition (in alloys) macro-non-uniformities.

A rotary (wafer or cathode) cell was disclosed by Grandia et al. in U.S. Pat. No. 4,304,641. That patent advocates nozzles of increasing size and uniformly spaced, or the same sized nozzles with decreasing radial spacing, in order to provide a non-uniform differential radial flow distribution on the wafer-cathode. It provides increasing flow rate along the wafer's radius in order to improve Ni—Fe thickness macro-uniformity. The technique relies on decreasing current efficiency with increasing flow rate, as described by Andricacos et al. in Journal of Electrochemical Society, Vol. 136, No. 6, pp. 1336-1340 (1989). However, in addition to decreasing current efficiency, increasing the flow rate also results in sharp increase of the iron content in the deposited permalloy film, as described by Andricacos et al. In addition, the techniques disclosed in the Grandia patent do not provide improved agitation inside features with high aspect ratio and, therefore, do not improve micro-uniformity. The problem is particularly problematic in areas near the center of the wafer, which receive reduced flow. The rotary cell of the Grandia patent requires a relatively low plating rate (about 0.05 µm/min for Ni—Fe alloy). A rotary jets cell was disclosed by Tzanavaras and Cohen in U.S. Pat. No. 5,421,987 (the '987 patent), incorporated herein by reference. The '987 patent discloses a plating cell incorporating a rotating anode/jet assembly ("RAJA"), producing turbulent high pressure jets flow across a wafer. The RAJA of the '987 patent is assembled in a manner to provide (time-averaged) uniform flow distribution of the jets across a facing wafer surface. The plating cell of the '987 patent facilitates high plating rate with good uniformities. The '987 patent discloses integrated jet nozzles and anode segments in one assembly.

Electrofilling problems become more severe with decreasing lateral (or width) dimension W and increasing aspect ratio (AR) of the openings. Aspect ratio is defined here as a ratio between the depth h of the opening and its smallest lateral dimension W: AR=h/W. For example, in today's most advanced copper filling of trenches and vias in integrated circuit interconnects, the openings may have an aspect ratio as high as 10:1 (h=1.5 µm; W=0.15 µm), and future trench and via openings will likely require W≤0.10-0.13 µm, and AR≥12:1. Reliable, void-free filling of such narrow and high AR openings imposes a great deal of difficulty.

In order to overcome the natural tendency to form voids in electrofilling of narrow openings, commercial electrolytes, such as acidic copper sulfate, usually include proprietary surface active "brightener" and/or "leveler" inhibitor additives. The proprietary additives usually comprise surface active organic compounds with functional groups containing sulfur and/or nitrogen atoms. These compounds adsorb onto growth sites of the depositing metal surface, thereby inhibiting (or suppressing) the metal deposition rate. The relatively stagnant electrolyte inside narrow openings results in poor replenishment and depletion of the inhibitor additive there. This depletion results in reduced inhibition and faster growth inside the openings. Due to better supply of the inhibitor at the top corners of the openings and the field, inhibition is stronger at the top corners and at the field (compared with inside the openings). The reduced inhibition inside narrow openings speeds up the plating rate there (relative to the field), thus facilitating void-free filling (or "superfilling") of narrow openings with large aspect ratios. The mechanism of superfilling narrow openings, using inhibiting additives, was proposed in several publications. For examples, see an article entitled: "Damascene copper electroplating for chip interconnects", by P. C. Andricacos, at al. in IBM Journal of Research and Development, Vol. 42(5), pp. 567-574, 1998, and an article entitled: "Copper On-Chip Interconnections", by P. C. Andricacos in The Electrochemical Society Interface, pp. 31-37, Spring 1999.

In order to achieve void-free "superfilling" of narrow openings, the beneficial effect of inhibition gradients must overcome intrinsic void-forming mechanisms due to (a) higher electric field (and current density) at the top corners of the openings and, (b) decreasing plating rate inside openings, along their depth, due to depletion (and gradient) of the plating ion there.

A common problem with soluble anodes (such as Cu anodes in an acidic copper sulfate electrolyte) is the in-situ generation and release of particles due to uneven anodic dissolution. Low anodic current density (like a weak selective etchant) tends to selectively (faster) dissolve grain boundaries and certain grain orientations, thus leading to anodic surface roughening and particle release. For example, dissolving Cu anodes in acidic cupric sulfate electrolyte often generates in-situ particles. Cu anodes often include other elements, such as phosphorus (P) in order to form an anodic film to reduce the particle generation. The dissolved phosphorus may be incorporated in the deposited Cu film, thereby adversely affecting its electrical and mechanical properties. Also, it takes long periods of pre electrolysis to establish the anodic film. Long periods without plating, or removal of the anode from the electrolyte, cause degradation of the anodic film. To prevent defects due to inclusion of particles in the deposited films, electroplating equipment vendors often place the anode(s) in a porous bag or in a basket or a cup separated from the cathode by a perforated screen or "diffusion plate" (or membrane, or filter). See for example, U.S. Pat. No. 6,126,798 to Reid et al. and U.S. Pat. No. 6,080,291 to Woodruff et al. The perforated screen or filter tend to clog in operation, thus requiring down time for periodic maintenance and cleaning and/or replacement. They also restrict electrolyte circulation around the anode surface, thereby increasing deleterious anodic passivation and polarization and thus limiting the operational plating current (or plating rate). In addition, while preventing larger size particles contamination of the deposited film, they are ineffective in preventing smaller size (sub micron) particles from reaching the cathode.

Other problems involved in prior art rotary cells include erratic and unstable electrical contact to the rotating metallic shaft or pipe, and high rotational friction and electrolyte leaks developing in the rotating seal.

Void-free electrofilling of deep and high aspect ratio openings requires complete wetting by the electrolyte of the exposed metallic surface (or the metallization seed layer) inside the openings. The openings may consist of vias, trenches, or patterned photoresist (or other insulating or dielectric layers). Inadequate wetting (or penetration) by the electrolyte inside very deep and narrow (high aspect ratio) openings results in deleterious electrofilling voids. Such voids may create open circuits or high electrical resistance path, thus impairing the functionality of the device. In addition, electrolyte may be entrapped inside such voids, leading to contamination and corrosion which further impair the long term reliability of the device. Such voids are considered to be unacceptable defects, lowering the manufacturing yield and reliability. They ought to be avoided.

Inadequate electrolyte wetting problems are particularly problematic in relatively wide, but very deep openings. In particular, wetting is difficult inside openings with depth in the range of about 5-100 µm and width in the range of about 5-200 µm. Such openings are frequently used in 3-D wafer packaging (for contacts through the wafer), in chip-scale packaging (CSP), wafer-scale packaging (WSP), TFH, MEMS, and systems on chip (SOC). They are prone to insufficient or inadequate electrolyte wetting. For example, vias of such dimensions in 3-D packaging may require several hours of immersion in the electrolyte, for its complete penetration into the vias to wet and plate the lower sidewalls and bottom of the vias. As the width of the openings decreases, capillary forces become stronger, thus improving the wetting. As a result, narrower openings wet better and faster than wider openings of the same depth. For this reason, wetting problems are less prevalent in submicron openings, used in VLSI and ULSI copper interconnects (having width of about 0.1-0.5 µm and depth of about 0.5-1.5 µm), than in the much wider ($\geq 5$ µm) and deeper ($\geq 10$ µm) openings encountered in packaging. Passive films, such as native oxides and/or surface contamination of the metallization layer, further exacerbate wetting problems. While they are readily accessible and relatively easy to remove from the top field surface (around the openings), they might be significantly more obstinate and harder to remove inside deep openings.

In light of the above, there is a need to overcome one or more of the above-identified problems.

SUMMARY OF THE INVENTION

One or more embodiments of the present invention satisfy one or more of the above-identified needs in the art. In particular, one embodiment of the present invention is a method for electrofilling a metal or alloy inside at least one opening surrounded by a field on a front surface of a substrate, wherein at least one surface inside the at least one opening includes an exposed metallic surface, said method including steps of: (a) immersing the substrate in an activation or wetting solution; (b) applying ultrasonic or megasonic vibrations to the substrate; and, after commencing applying ultrasonic or megasonic vibrations to the substrate, (c) applying high pressure jets of an electrolyte to the substrate, said electrolyte includes metallic ions of said metal or alloy; and (d) applying an electroplating current to the substrate to electroplate said metal or alloy inside the at least one opening.

DETAILED DESCRIPTION

Figure 1:
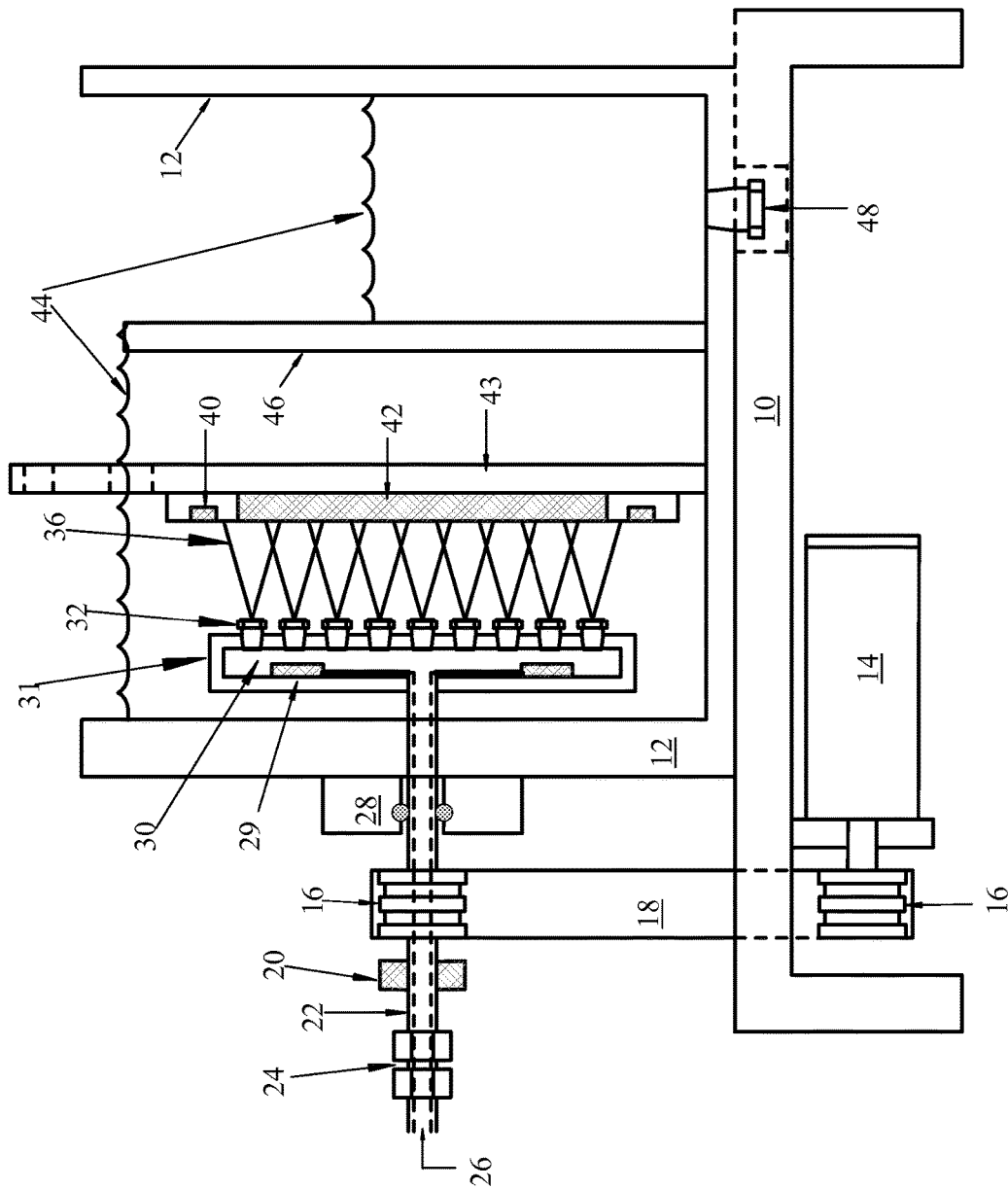
FIG. 1 shows a schematic side cross-section of a JECD plating cell that is fabricated in accordance with one or more embodiments of the present invention.

FIG. 1 shows a side cross-sectional view of a plating cell for electrofilling, in accordance with one embodiment of the present invention. The plating cell can be similar to the plating cell disclosed in U.S. Pat. No. 5,421,987 (the '987), incorporated herein by reference. However, one or more embodiments of the present invention include other cell configurations. For example, the wafer (or cathode) can be positioned horizontally, facing up or down, or the anode(s) can be separate from the jet inlets (or nozzles).

In the embodiment shown in FIG. 1, table 10 supports main plating tank 12. Motor 14 activates pulleys 16 through drive-belt 18 to rotate pipe-shaft 22. Alternatively, pipe-shaft 22 can be coupled to motor 14 directly or by a variety of mechanisms, such as, for example and without limitation, gears. Rotating electrical contacts 20 provide continuous electrical contact to the anode(s) through rotating metal pipe-shaft 22. Contacts 20 may be comprised of brushes or a metallic journal (or sleeve) bearing. Plating solution or electrolyte 26 is pumped into rotating fitting 24, and through it to rotating pipe-shaft 22, and on into a rotating jets assembly 30. One or more anodes (see for example 50 in FIGS. 2-4) are electrically connected at their back side to metal ring 29. The latter is electrically connected to metal pipe-shaft 22, thus providing continuous electrical path between rotating electrical contacts 20 and the anode(s). All metal parts exposed to the electrolyte, except for the soluble anode(s), are preferably made of inert or passivated metals or alloys which do not react with, or dissolve under anodic polarization into the electrolyte. Such metals may include Ti, Cr, Ta, Nb, W, Mo, Pd, Pt, Au, stainless steel, or alloys comprising one or more materials from this group. Exposed metal parts may include pipe-shaft 22, metal ring 29, jet nozzles 32, and/or the jets support structure 31. For example, a Ti pipe-shaft 22 was used for plating Ni—Fe alloys, and a stainless steel pipe-shaft 22 was used for plating copper from acidic copper bath.

A high pressure pump (not shown) is connected on its intake side to a large reservoir tank (not shown) and on its exhaust side through one or more fine pore filter(s) (not shown) to rotating fitting 24. The pump provides a high pressure flow of filtered electrolyte 26 through rotating fitting 24, rotating pipe-shaft 22, and jets support structure 31, to one or more jet nozzles (or inlets) 32. Electrolyte level 44 is set in main plating chamber 12 by overflow weir 46. From overflow chamber 46, the electrolyte is drained through drain outlet 48, and circulated back into the reservoir tank (not shown). Continuous circulation of the electrolyte is maintained during the plating operation.

Jets support structure 31 is made of a sealed cavity (or a chamber, or a hollow platen), to which are attached jet inlets (or nozzles) 32. Support structure 31 can be constructed of one or more of the following materials: insulating plastic, inert or passivated metals, and/or the same metal as the anode(s). In a preferred embodiment, structure 31 comprises a metallic platen which also serves as an (inert or soluble) anode. Rotating pipe-shaft 22 is inserted through a wall of the plating tank 12 via rotating seal 28 equipped with an O-Ring. The pressurized electrolyte in jets assembly 30 is injected through nozzles (or inlets) 32 to form powerful jets 36. Jets 36 have a fan-like shape or a conical shape and they partially overlap each other at the substrate's front surface. They impinge on the front surface of conductive substrate (or cathode-wafer) 42 in a direction substantially normal to the front surface and create a vigorous substantially uniform flow distribution of the electrolyte over the front surface of substrate 42.

Substrate 42 and (optional) bias ring 40 are located on wafer holder fixture 43. Substrate 42 is immersed in electrolyte 44 in close proximity to one or more nozzles 32, in order to overcome the severe damping of the jets by the liquid bulk. For a typical pressure range of about 30-50 psi (at the inlet to rotating fitting 24), the distance between nozzles 32 and the front surface of substrate 42 is about 5-40 mm. Higher inlet pressure allows larger separation, and vice versa. Alternatively, substrate 42 and jets assembly 30 may be placed outside the electrolyte, or partially immersed in it. In such cases the distance between the one or more jet nozzles (or inlets) and the substrate's front surface can be increased significantly. However, it is preferable to have both the jets assembly and the substrate completely immersed in the liquid. Care should be taken to avoid excessive jets pressure and/or proximity to the substrate, in order to avoid damage by the impinging jets to devices, patterned layers, and/or a plating mask on the substrate's surface.

Impinging powerful jets 36 create vigorous agitation and/or turbulent flow at the substrate's surface, thus facilitating enhanced replenishment in exposed areas. In the case of electrofilling Damascene and DD interconnects, in addition to the plating metallic ions, the electrolyte contains at least one surface active inhibitor additive. The impinging jets greatly enhance the replenishment of the surface active inhibitor(s) to the field and top corner of the openings, while the electrolyte inside the narrow and high aspect openings remains essentially stagnant. As a result, inhibition is much more prevalent (or enhanced) on the field and top corners of the openings than inside the openings, thereby enhancing the superfilling mechanism. The enhanced gradient of the inhibitor(s) facilitates improved electrofilling capability and allows substantial increase of the operational plating rate. In the case of openings with only exposed metallic surface at their bottom (no metallization layer on the field and sidewalls of the openings), a surface active inhibitor may not be required for the electrofilling. However adding to the electrolyte a wetting agent, such as sodium lauryl sulfate or Triton 100×, might be desirable in order to reduce the electrolyte's surface tension, to thereby improve its wetting and penetration capability. In both cases (with or without seed layer on the sidewalls and top field), the vigorous agitation greatly improves replenishment of the plating ions, thereby facilitating much faster electrofilling and throughput, and also improving the uniformities. Each spot on the substrate (or wafer) is subject to periodic pulsating jets produced by the rotating jets (about an axis substantially perpendicular to the substrate's front surface). In alternative embodiments, wafer 42 rotates about an axis substantially perpendicular to its front surface, while jets 36 remain stationary, or both the wafer and the jets may rotate about the same axis in the same or opposite directions. The frequency of the pulsating jets is determined by the rotation speed of the jets assembly (or wafer) and by the number of jet nozzles (or inlets) rows on the jets assembly.

Figure 2:
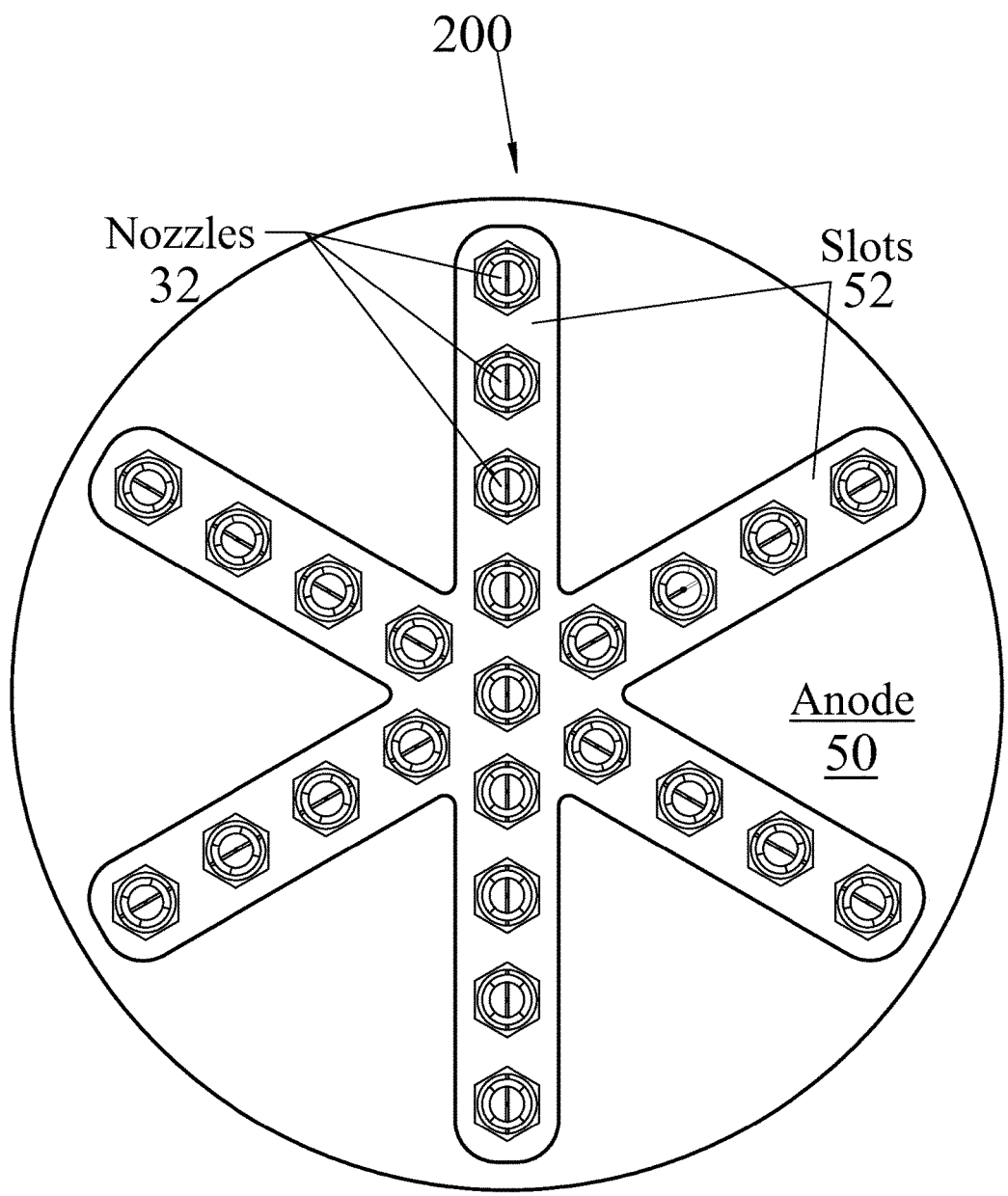
FIG. 2 shows an anode/jets assembly that is fabricated in accordance with one or more embodiments of the present invention.

FIG. 2 shows one embodiment according to the invention. Anode/jets assembly 200 comprised of single-piece anode 50 with one or more radial (or diametric) slots 52, and holes (not shown) cut into the slots for placing jet inlets (or nozzles) 32 therein, along radial rows. In an alternative embodiment (not shown), holes for nozzles (or inlets) 32 are cut directly into anode 50, without slots. For example, FIG. 2 shows a configuration in which six radial slots 52 were cut into single-piece Cu anode 50. The nozzles are positioned inside the slots in six radial rows, in axial symmetry about the center of anode/jets assembly 200. In order to avoid excessive flow in the center of the wafer, it may be necessary to eliminate or restrict the flow of the central nozzle (or inlet) in the assembly. Smaller or larger number of radial rows can be used. Smaller number of rows allows larger surface area of the anode, while larger number of rows increases the jets pulse frequency, but reduces the anode surface area. Larger surface area of the anode is desirable in order to minimize anodic polarization and passivation. However, smaller number of rows means longer periods of time between impinging jet pulses, leading to deleterious effects associated with inadequate agitation. The anode can be soluble or insoluble (inert). For example, in the case of copper deposition, the anode may consist of soluble copper or it may consist of insoluble metals such as platinized Ti, platinized Ta, or platinized Nb.

Figure 3:
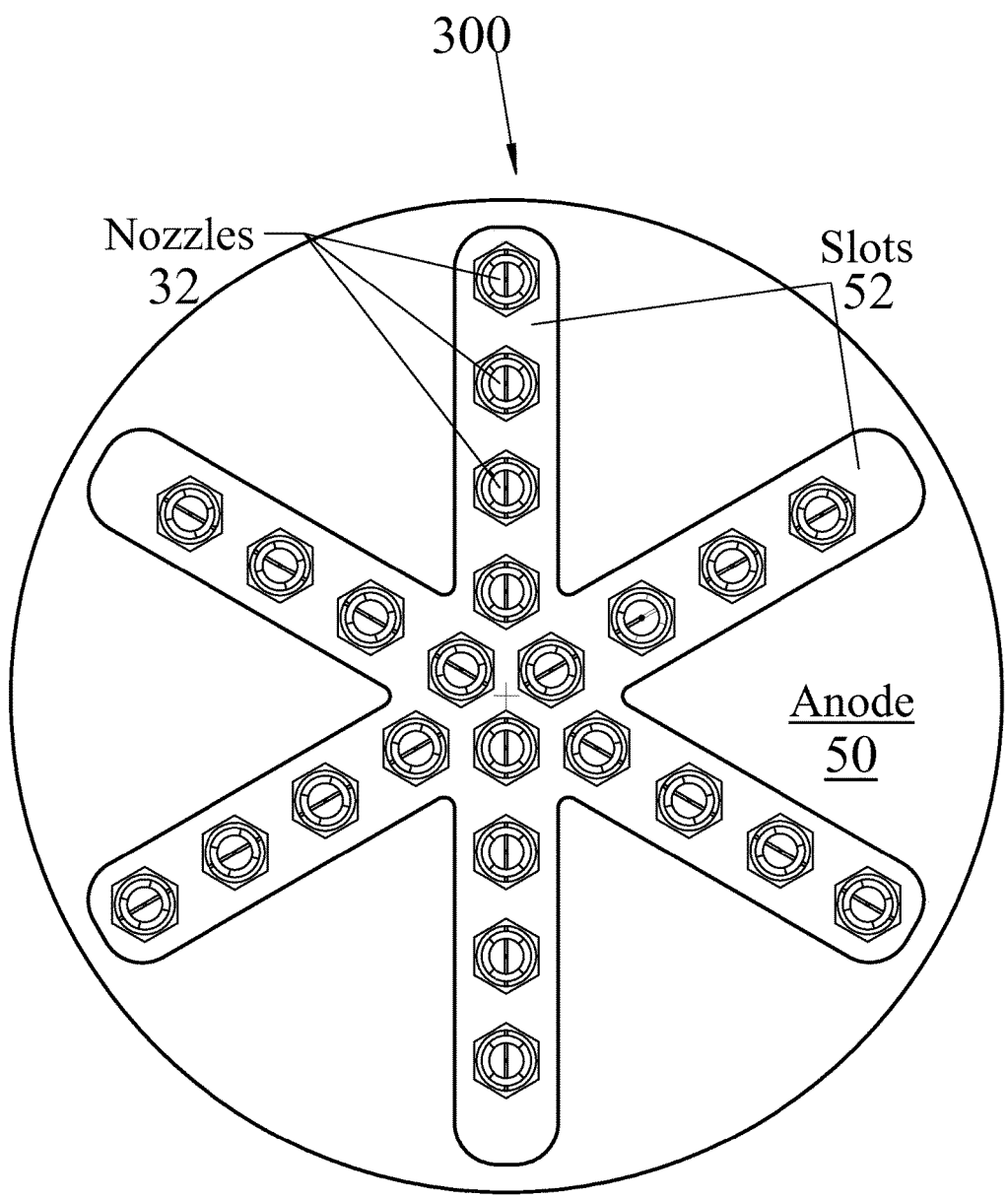
FIG. 3 shows an anode/jets assembly that is fabricated in accordance with a preferred embodiment of the present invention.

FIG. 3 shows a preferred embodiment of the invention. In accordance with this embodiment, anode/jets assembly 300 comprises staggered jet inlets or nozzles 32, configured inside radial slots 52 cut in single-piece anode 50. Alternatively, holes for nozzles (or inlets) 32 are cut directly into anode 50, without slots 32. The staggered nozzles (or inlets) configuration improves overlapping of emanating jet cones (36 in FIG. 1) across the wafer's surface. It effectively eliminates concentric rings of "dead areas" corresponding to intermediate radii between the nozzles (or inlets). This configuration greatly improves the plating uniformities. To ensure good uniformity in the center of the wafer, it may be necessary to increase or restrict the flow of the inner-most nozzles (or inlets) in the assembly, and/or eliminate the central nozzle altogether. The anode can be soluble or insoluble (inert).

Example 1

Using the plating cell shown in FIG. 1 and the anode/jets assembly shown in FIG. 3, a copper (Cu) film was electroplated from acidic copper sulfate electrolyte, containing ~0.3M cupric ions and ~10% (v/v) sulfuric acid. The electrolyte also contained proprietary two component additives ("carrier" and "additive"), PPR Gleam, supplied by Lea Ronal Co. The "carrier" was maintained at a nominal concentration of about 15 ml/l, and the "additive" at a nominal concentration of about 1.5 ml/l. The electrolyte was maintained at room temperature (~23° C.), using a Neslab's Recirculating Chiller circulating liquid coolant through a titanium tubing coil immersed in the electrolyte reservoir tank (not shown). Using single-piece Cu anode 50 having radial slots 52 cut into it for staggered nozzles configuration (such as FIG. 3), excellent thickness uniformity (standard deviation of $1\sigma=2.4\%$) was obtained across an 8" silicon wafer 42. The silicon wafer was previously coated with successive layers of $SiO_2$, $TaN_x$ barrier, and Cu seed layer. The inlet jets pressure was about 40 pounds per square inch (psi), the total flow rate was about 3.8 gallons per minutes (GPM), the rotation speed of the anode/jets assembly 300 was about 20 revolutions per minute (RPM), and the plating current density was about 15 $mA/cm^2$ (plating rate of ~0.35 µm/min). Continuous electrical contact to the wafer's peripheral edge was provided by an electrically conductive elastomer O-ring tubing (75 in FIG. 7).

Example 2

Using similar cell configuration, anode/jets assembly, and plating parameters as used in Example 1, but with a plating current density of about 120 $mA/cm^2$ and a plating duration of 34 seconds, a plating rate of about 2.8 µm/min was obtained. The deposited Cu thickness was about 1.5 µm, and the wafer was fully bright. The surface roughness was only Ra=73 Å, as measured by atomic force microscope (AFM).

The plating rate described in Example 2 is about eight times (8×) faster than the usual plating rate of about 0.35 µm/min, employed by most prior art plating cells without the jets. Thus, the use of jets plating can readily increase the cell throughput by a factor of 4×-8×, at no extra cost. Alternatively, fewer modules (plating cells) can be used in a plating system, thus requiring much smaller footprint and offering significantly lower cost of ownership.

It was also found that, as current density increases, the roughness decreases and the Cu deposit becomes brighter. Increasing the plating rate was also beneficial for the elimination of the deleterious surface bumps, spikes and humps, generally referred to as "overburden". Such overburden is usually found after Cu plating over filled trenches and vias when using the prior art equipment and methods. Such bumps, spikes and humps may cause excessive erosion and dishing during successive CMP steps. Some plating vendors now recommend the use of a third additive component (or "leveler") in order to eliminate such bumps and humps. The additional (third) component greatly complicates the required bath analysis and control, and may also result in top center voids and poor filling of larger openings. In contrast, the JECD high plating rate facilitates flat surface topography with only two additive components. Leveling mechanism becomes more prevalent with the increasing jets plating rate. Utilizing the JECD plating, as soon as superfilling mechanism inside the openings is complete, leveling mechanism commences to flatten protrusions growing above the flat surface. Protrusions develop naturally due to coalescing top corners. In order to obtain strong and efficient superfilling and leveling mechanisms, large gradients of the inhibitors (in the additives) are required. In fact, the two are just different manifestations of the selective inhibition mechanism. Jets plating facilitate both mechanisms by significantly reducing the diffusion layer thickness, thereby increasing these gradients.

Example 3

Using similar cell configuration and plating parameters as in Example 1, excellent Cu superfilling capability was achieved. 1.4 µm deep trenches with widths down to 0.05 µm (at their bottom) and aspect ratio of about 28:1, were void-free electrofilled at current density range of 30-60 mA/cm$^2$ (plating rate of 0.7-1.4 µm/min). The vigorous turbulent jets increase the inhibitor(s) gradient across the diffusion layer to the field, thereby greatly enhancing the superfilling mechanism.

Example 4

Using similar cell configuration and plating parameters as in the previous Examples, very wide process latitude was demonstrated. The additive concentration was varied over the range of 0.7-2.0 ml/l (285%) and the plating current density was varied over the range of 15-60 mA/cm$^2$ (400%), without any deleterious effects. All openings ranging in width from 0.05-5.0 µm, and larger, were filled without voids. Large process latitude simplifies the control, thereby facilitating cost reduction. The vigorous turbulent jets increase the gradients across the diffusion layer, thereby greatly improving the process latitude.

Example 5

Using similar cell configuration and plating parameters as in the previous Examples, a single-piece Cu anode, such as shown in FIGS. 2 and 3, dissolved evenly and smoothly without generating or releasing in-situ particles. The anode comprised high purity (OFHC) Cu sheet with grain size of about 1 mm. It did not contain phosphorus. The anode front surface was exposed to vigorous electrolyte circulation of the reflected jets from the wafer, and the rotation of the anode/jets assembly. Due to the relatively high anodic current density, the anode was essentially electropolished. There was no visible anodic film forming during electrolysis. Also, no pre-electrolysis period to prepare an anodic film was necessary.

In accordance with one embodiment of the invention, a soluble anode dissolves evenly and smoothly, without generating in-situ particles, by subjecting the anode surface to vigorous electrolyte flow and/or by using relatively high anodic current density (sufficient to dissolve the anode in an isotropic non-selective manner). The dissolving anode, such as solid Cu in acidic copper plating bath, is preferably comprised of high purity metal and relatively small grain size (~1 mm).

Figure 4:
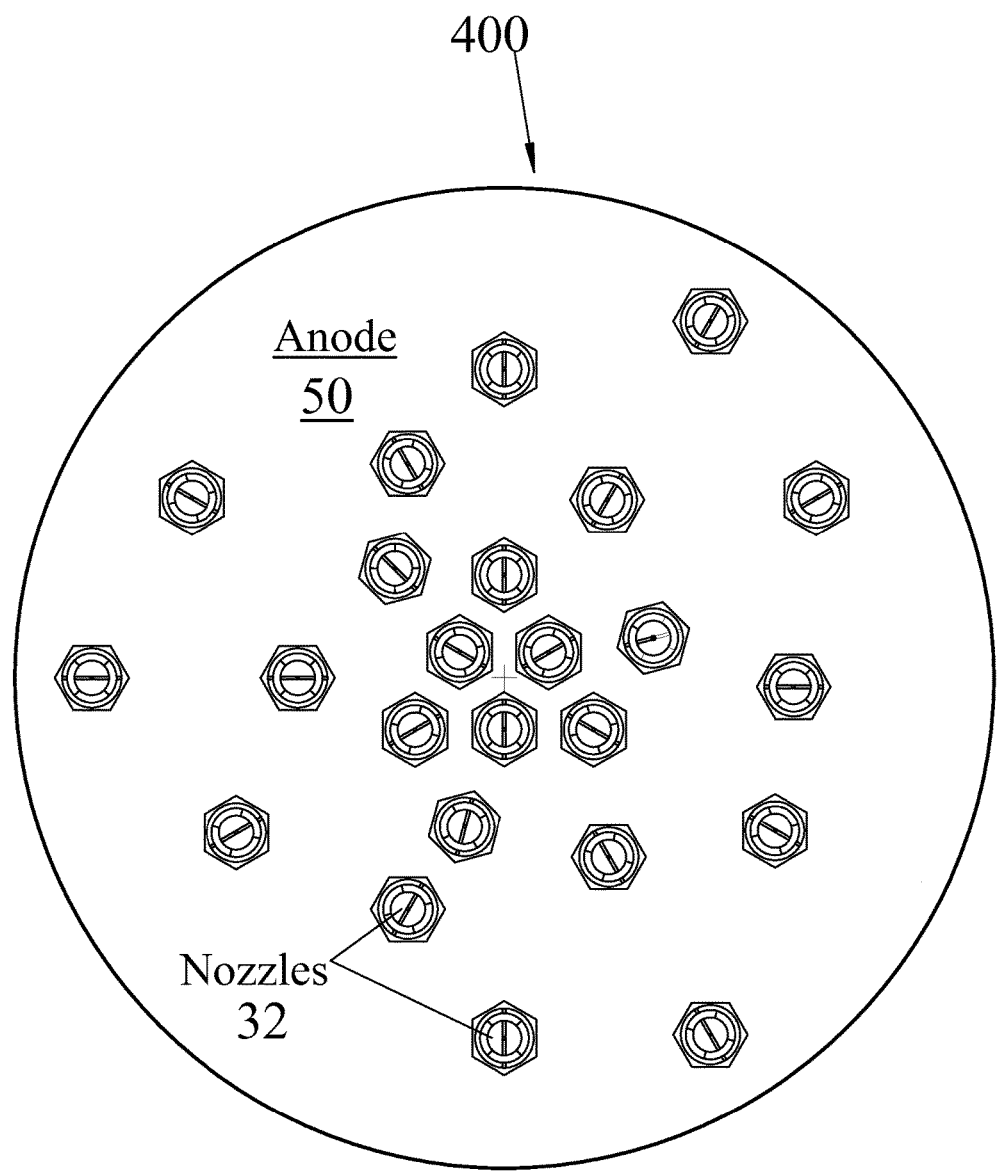
FIG. 4 shows an anode/jets assembly in accordance with one or more alternative embodiments of the present invention.

FIG. 4 shows an alternative preferred embodiment of the invention. Anode/jets assembly 400 comprising array of jet nozzles (or inlets) 32 which need not be configured along radial (or diametric) rows. Rather, nozzles (or inlets) 32 are positioned at fixed incremental radii across anode 50 in a manner to produce (time-averaged) uniform jet flow distribution across the facing wafer's (42 in FIG. 1) surface. Elimination of the slots (such as in FIGS. 2 and 3) in anode 50, increases the anodic surface area. The incremental radii are small enough to eliminate or to minimize concentric rings of "dead areas" on the wafer, at radii between the nozzles (or inlets). Assembly 400 may comprise one or more nozzles (or inlets) per each incremental radius. The preferred configuration for two or more nozzles (or inlets) per incremental radius, is in axial symmetry about the center of assembly 400. For example, FIG. 4 shows a three-fold axial symmetry. Other axial symmetries, such as two-fold or four-fold symmetries, can also be utilized. Such nozzles (or inlets) array configuration produces effective turbulent jets flow distribution, with equivalent or better uniformities than the radial rows embodiments (cf. FIGS. 2-3). It has the advantage that nozzles (or inlets) 32 are less crowded on anode 50 (than in embodiments comprising radial rows). It offers easy access to the nozzles on the anode for placement, replacement, and maintenance. As described in above embodiments, it may be necessary to increase or restrict the flow of the inner-most nozzles (or inlets) in the assembly, and/or eliminate the central nozzle altogether, in order to ensure good uniformity in the center of the wafer. The anode can be soluble or insoluble (inert).

Figure 5:
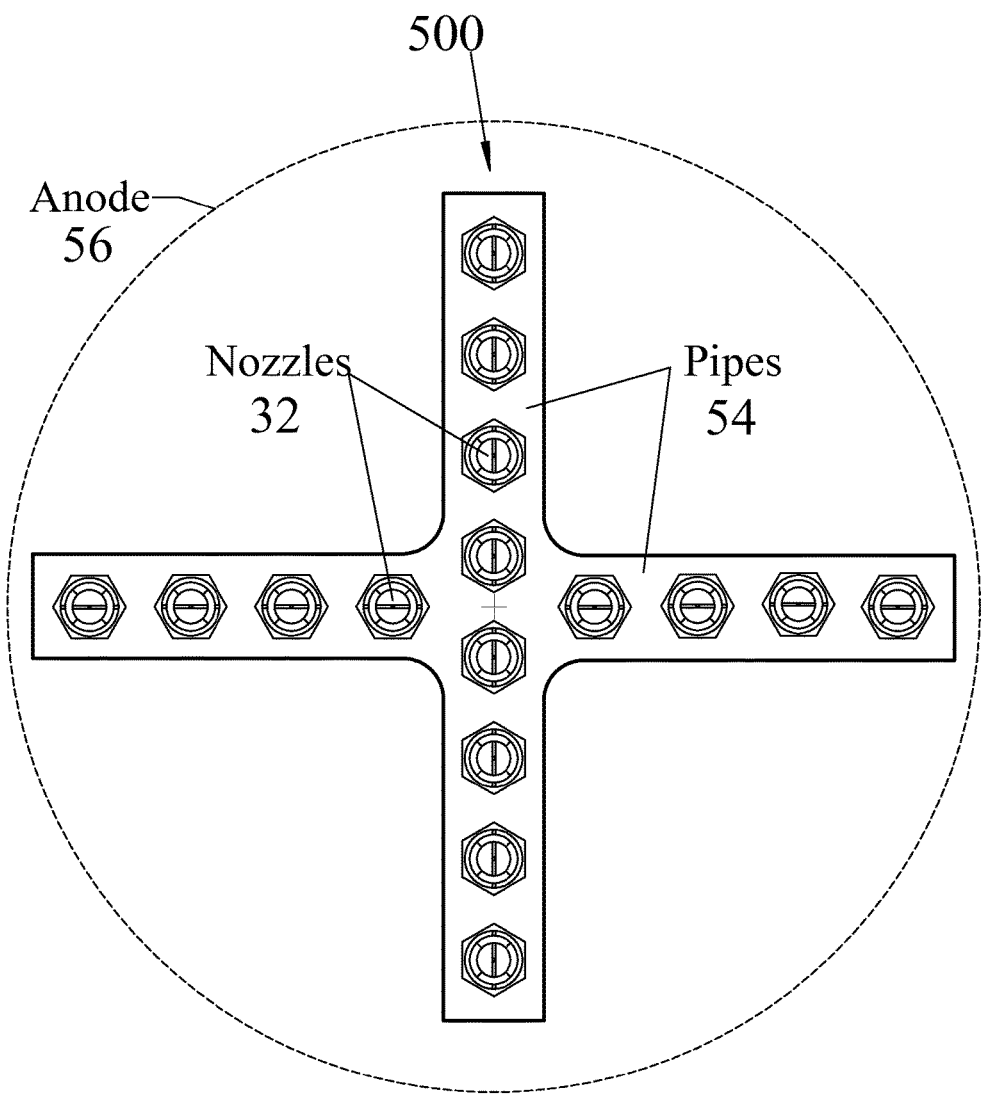
FIG. 5 shows a jets assembly that is fabricated in accordance with one or more embodiments of the present invention.

FIG. 5 shows another embodiment of the invention. Jets assembly 500 comprises nozzles (or inlets) 32 disposed on one or more pipes 54. Jet nozzles (or inlets) 54 are separate from the anode(s), and is not integrated with the anode(s). The anode(s) outline is shown as dashed line 56. It can be disposed behind jets assembly 500 (relative to the substrate). Either jet assembly 500 or the wafer, or both, rotate relative to each other about an axis substantially normal to the substrate's front surface, in a manner to provide (time-averaged) uniform turbulent flow distribution of the jets across the facing wafer. During electroplating, the wafer can be positioned to face down or face up horizontally, or it can be configured in a vertical position. A stationary anode (its outline 56 shown in FIG. 5), or anodes, can be positioned to face the wafer (or substrate) behind the jet nozzles (or inlets) assembly. Additional anode(s) can be configuration along the side walls of the plating cell in order to maximize the anode surface area and minimize deleterious effects due to anodic polarization. The anode(s) can be soluble or insoluble (inert). Jets assembly 500 can be configured along one or more inlet pipes (or tubes) on the side facing the wafer. As shown in FIG. 5, the nozzles can by positioned in a staggered manner along the pipes in order to improve overlapping of the impinging jets, thereby improving the plating macro-uniformity. It may be necessary to eliminate the central nozzle (or inlet), or restrict its flow, in order to avoid excessive flow in the central region. The configuration of separate jets assembly from the anode(s) has the distinct advantage of maximizing the anode surface. Another advantage is that the jets assembly can rotate alone without the anode, thereby significantly reducing the mass of the rotating assembly. It also offers a greatly simplified cell design, facilitating convenient and easy access to the nozzles and to the anode(s) for replacement and maintenance. Preferably, anode(s) 56 should be located close behind nozzles or inlets pipes 54, in order to ensure adequate vigorous circulation of the electrolyte across the anode surface. Adequate circulation is essential in order to minimize deleterious anodic polarization and passivation. However, this configuration provides reduced electrolyte flow and circulation across the anode's surface (compared with previous embodiments). The farther anode(s) 56 is behind jets pipes 54, the less vigorous is the electrolyte flow across the anode. Although FIG. 5 shows two pipes at 90° to each other, other number of pipes and symmetries are within the scope of the invention. For example, a single pipe, or three or more pipes can be used, preferably with the staggered nozzles (or inlets) configuration.

Figure 6A:
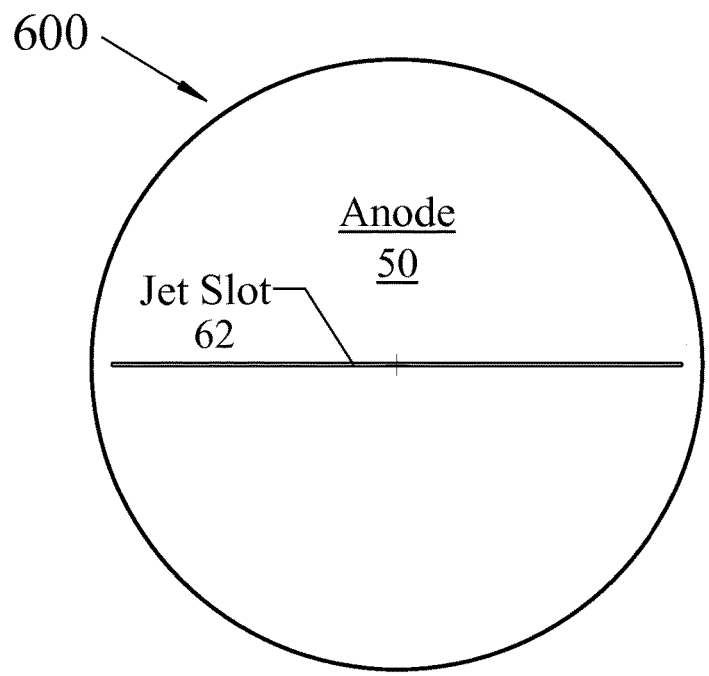
FIG. 6 shows alternative embodiments utilizing jet slots assemblies for obtaining uniform jets flow distribution across a substrate's surface.
Figure 6B:
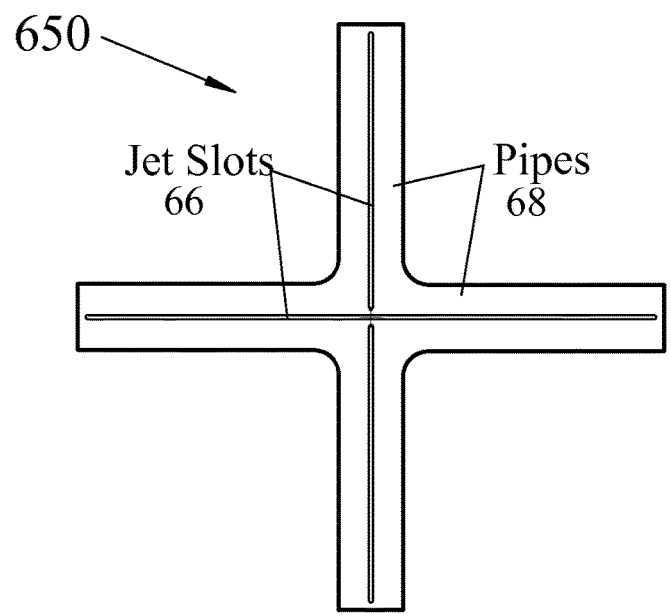

FIG. 6 shows another embodiment of the invention. Jet(s) assemblies 600 and 650 comprise one or more narrow radial (or diametric) inlet jet slots 62, 66. While FIG. 6(*a*) shows an embodiment comprising anode/jets integrated assembly 600, the embodiment of FIG. 6(*b*) comprises a separate jets assembly 650 from the anode(s). In the latter case, a stationary anode (not shown) is preferably positioned behind jet slots assembly 650, facing the substrate (not shown). Each narrow jet slot 62, 66 produces a continuous jet, in the form of a continuous sheet, of electrolyte flow across the wafer's surface. The narrow jet slot(s) can be configured in a single-piece anode (62 in FIG. 6(*a*)), or along one or more inlet pipes facing the substrate or wafer (66 in FIG. 6(*b*)). As in earlier embodiments, either jet slots assembly 600, 650 or the wafer rotates relative to each other about an axis substantially normal to the substrate's front surface (through the center of the jets assembly).

Although FIG. 6(*a*) shows a single continuous narrow jet slot 62 in anode 50, more radial (or diametric) jet slots in the anode are within the scope of the present invention. Similarly, although FIG. 6(*b*) shows radial jet slots 66 in two pipes 68 at 90° to each other, one or more jet slots in one or more pipes configured in other symmetries, are also within the scope of the present invention. For example, a single diametric jet slot in a single pipe can be used, or two radial jet slots in a single pipe are possible. Two radial jet slots, without the slots passing through the center, may be necessary in order to avoid excessive flow in the central region. Although FIG. 6(*b*) shows two vertical jet slots 66 which do not pass through the center and a horizontal jet slot passing through the center, both may also be continuous or discontinuous through the center. The same also applies to the embodiment shown in FIG. 6(*a*). Two radial jet slots, without the slots passing through the center, may be necessary in order to avoid excessive flow in the central region. The main advantages of the continuous jet slots are the maximization of the front anodic surface area and the elimination of "dead area" rings on the substrate due to inadequate overlapping of jet cones (or fans) from individual nozzles (or inlets).

Figure 7:
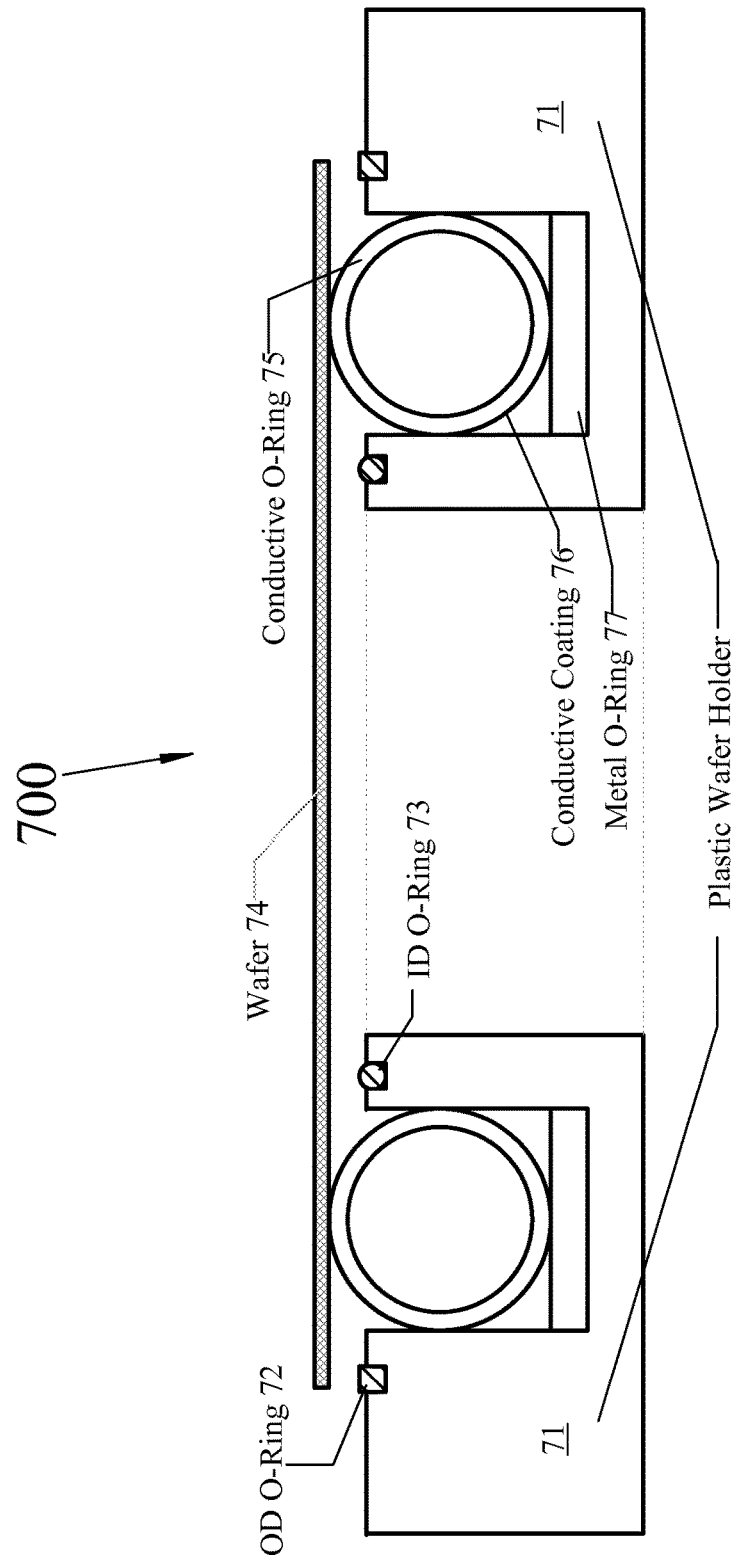
FIG. 7 shows a schematic cross-section of a wafer holder that is fabricated in accordance with one or more embodiments of the present invention.

FIG. 7 shows another embodiment of the invention. The figure is a schematic (not to scale) cross section through a wafer holder assembly 700, such as, for example, 43 in FIG. 1. FIG. 7 shows wafer holder 71 with mounted wafer 74, with its front surface facing down. Wafer 74 makes continuous electrical contact near and around its peripheral edge to an elastomer conductive O-Ring 75. The latter may comprise, for example, a silicone tubing with metallic coating 76 on its outside surface. Such a conductive tubing is supplied, for example, by Pacific Rubber Company of California. It comprises a soft silicone tubing coated with metallic silver on its outside surface. The tubing can be of a circular or a U-shaped cross section. Alternatively, a soft solid conductive O-Ring can be used. The purpose for using the soft conductive elastomer O-Ring is to facilitate adequate low resistance continuous contact to the wafer's peripheral front surface, facilitating large plating current for high plating rate. Metallic tab or finger contacts around the periphery, such as disclosed in the '987 patent, may cause mechanical damage (scratches and wiping-off) to the thin seed and/or barrier layers on the wafer. They often leave mechanical or pressure marks and/or tarnish or corrosion marks on the plated film. These may trigger delamination and pull-outs during successive CMP stages. The metallic contacts are also susceptible to corrosion and tarnishing, leading to unstable contact resistance. Also, when applying large plating current during the initial stage of plating, they may cause local "burns" or melting of the seed layer in the vicinities of the tab or finger contacts. The soft elastomer conductive O-Ring 75 eliminates such mechanical damage to the seed layer and facilitate very large plating currents without melting the seed layer. Plating currents as high as 32 Amperes (corresponding to plating rate of about 105 mA/cm$^2$) were used with such soft elastomer conductive O-Ring to plate 8" Si wafers. No mechanical, tarnishing, melting damage, or any other damage to the seed layer was found. Conductive O-Ring 75 is in intimate (electrical) contact with a metallic O-Ring 77. Both conductive O-Ring 75 and metallic O-Ring 77 are embedded inside a groove in insulating wafer holder 71. Metallic O-Ring 77 is electrically connected to an external plating power supply. This establishes a continuous electrical connection from the external power supply to the plating cathode.

In addition to the elastomer conductive O-Ring 75, one or more insulating elastomer O-Rings 72, 73 may also be used in order to seal and protect conductive O-Ring 75 from the electrolyte and/or to seal and protect the wafer's edge or back side from the electrolyte. For example, an insulating ID O-Ring 73 (protecting conductive O-Ring 75) may be used with, or without, additional insulating OD O-Ring 72 (protecting the wafer's edge and/or back side). The additional insulating O-Rings 72, 73 may comprise a soft solid (such as rubber foam or felt) or tubing (such as silicone). If conductive elastomer O-Ring 75 is exposed to the electrolyte during plating, it may be plated by the depositing metal. The plated metal on the conductive O-Ring can be stripped periodically by using a wet selective etchant which dissolves the plated metal but does not attack the conductive O-Ring or its metallic coating 76. For example, plated Cu on conductive silicone O-Ring 75 with silver coating on its outside surface can be stripped, for example, by immersing the conductive O-Ring in an etchant comprising 50 g ammonium persulfate, 1000 ml of deionized or distilled water, and 5 ml of concentrated sulfuric acid. Using insulating OD O-Ring 72 and/or insulating ID O-Ring 73 eliminates the need for such periodic stripping.

In accordance with another embodiment of the invention, rotating electrical contacts, such as 20 in FIG. 1, may comprise one or more oil-impregnated sintered metallic (such as brass) sleeve (or journal) bearings. In operation, the sleeve (or journal) bearing remains stationary, and is electrically connected to the external circuit (such as the positive terminal of a power supply). The diameter of rotating metallic shaft or pipe (such as 22 in FIG. 1) has close fit to the internal diameter of the bearing, in order to ensure stable and quiet contact between the two. An alternative metallic sleeve bearing may be comprised of dry leaded bronze (such as Cu—Sn—Pb—Zn Microcast™) or dry silver bronze. Both types of the sleeve bearings are supplied, for example, by Applied Industrial Technologies of Mountain View, Calif. Such bearings allow operation with very high current capacity and with extremely quiet and stable contacts. In contrast, brush contacts (such as spring-loaded graphite) disclosed in the '987 patent, proved to be very erratic and noisy (as was seen on a chart recorder) when used for high plating currents.

In accordance with yet another embodiment of the invention, a rotating seal, such as 28 in FIG. 1, comprises Teflon™ (or other self lubricating inert plastic) O-Ring with an inserted slanted ring spring. For examples, such rotating seals are supplied by Ball Seal Engineering Co. of Santa Ana, Calif. Such rotary seals were found to be most effective for low-friction and long service time, without electrolyte leaks. In contrast, regular solid Teflon™ or Viton™ O-Rings typically produce large rotary friction and start to leak after short time of service.

Other embodiments of the invention provide several activation methods aimed at improving electrolyte wetting and penetration inside very deep openings. Some of these methods can be utilized directly (in-situ) in the plating solution (electrolyte in the case of electroplating, or electroless solution in the case of electroless plating). In other embodiments, a separate activation solution is used prior to plating, and then followed by immersion of the workpiece (or substrate) in the plating solution for filling the openings by electroplating or electroless plating. In the latter cases, the activation solution and the plating solution can be contained in separate chambers, or the same chamber can be used with replacement of the activation solution by the plating solution. Each of the methods described below can be utilized alone, or in a conjunction with one or more of the other methods described below.

In accordance with one embodiment of the invention, ultrasonic vibrations, and more preferably megasonic vibrations, are used in the activation (or wetting) solution to enhance wetting and penetration of deep openings. The activation (or wetting) solution may comprise the same or similar solution to the plating solution. It may also include one or more wetting agents (surfactants) and an acid or other chemicals designed to remove surface oxides and/or surface contamination from the metallic surface. The activation (or wetting) can be used in a separate activation-wetting bath prior to transfer of the substrate to the plating bath, or in-situ in the plating bath, where the plating bath also serves as the activation-wetting solution. In a preferred embodiment, the ultrasonic (or preferably megasonic) transducer is attached to the back of the substrate or substrate's holder, or immersed in the plating bath, or attached to a sidewall or the bottom of the plating cell. In a preferred embodiment, ultrasonic (or preferably megasonic) vibrations are applied to the substrate in the plating bath, in an activation-wetting step prior to the plating, followed by an electrofilling step in the same plating bath (with, or without, ultrasonic or megasonic vibrations).

In another embodiment of the invention, dry plasma ashing, sputter etching, plasma etching, or ion bombardment, can be used in order to remove passive films and/or surface contamination prior to plating. For example, one can use two-step plasma ashing to remove carbonaceous contamination in the first step, and to remove passive oxide films in the second step, from a copper seed layer. The first step may include plasma ashing with oxygen gas (with, or without, argon or nitrogen) in order to "burn-off" carbonaceous surface contamination. The first step with the oxygen gas oxidizes the copper surface, thus creating a passive oxide film on the copper surface. The second step is aimed to remove the oxide film. It may consist of either plasma ashing with hydrogen in nitrogen (or in argon) gas mixture, and/or by dipping the workpiece (or substrate) in an acidic solution (preferably containing at least one wetting agent) which does not significantly attack copper but dissolves the copper oxide film. Plasma ashing with hydrogen containing gas mixture is very efficient for removing the oxide film. However, excessive power or ashing time may result in undesirable blistering of the copper seed layer. The activation-wetting solution may include, for example and without limitation, about 5-10% (v/v) HCl, or about 5-10% (v/v) $H_2SO_4$, and may also include one or more wetting agents, such as Triton 100× or sodium lauryl sulfate. Wetting agent reduces surface tension of the solution, thereby improving its wetting and penetration capability inside very deep openings. Adding a dilute acid, such as hydrochloric acid, sulfuric acid, phosphoric acid, or a mixture thereof, dissolves the passive oxide film without substantial attack on the metallization (or seed) layer. The dipping can be conveniently done in-situ in the plating bath prior to the onset of plating. Alternatively, the activation-wetting step can be done prior to plating in a separate solution used for activation and wetting.

In accordance with a preferred embodiment of the invention, ultrasonic vibrations or, more preferably megasonic vibrations, can be used in-situ in the plating electrolyte during both the activation-wetting step prior to the electrofilling, and during the JECD electrofilling step. The ultrasonic or megasonic vibrations can be utilized in conjunction with jets plating in order to further enhance the electrolyte agitation. This embodiment is particularly advantageous for fast, reliable, and smooth electrofilling of very deep (10-100 µm) and relatively wide (5-100 µm) openings, such as vias and grooves used in 3-D and high density packaging.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative.

What I claim is:

1. A method for void-free electrofilling a metal or alloy inside at least one opening surrounded by a field on a front surface of a substrate, wherein at least one surface inside the at least one opening comprises an exposed metallic surface, said method comprising steps of:
   (a) immersing the substrate in an activation or wetting solution;
   (b) applying megasonic vibrations to the substrate; and after commencing step (b):
   (c) applying a turbulent flow of an electrolyte across the substrate, said electrolyte comprises metallic ions of said metal or alloy; and
   (d) applying an electroplating current density to the substrate;
   wherein a combination of the turbulent flow of the electrolyte and the current density produces void-free electrofilling of said metal or alloy inside the at least one opening;
   wherein the activation or wetting solution is different from the electrolyte;
   and wherein said steps (a), (b), (c), and (d) are performed in the same electrochemical deposition (ECD) cell, and said step (d) comprises applying an electroplating current density in a range from about 20 $mA/cm^2$ to about 120 $mA/cm^2$ to the substrate.

2. A method for void-free electrofilling a metal or alloy inside at least one opening surrounded by a field on a front surface of a substrate, wherein at least one surface inside the at least one opening comprises an exposed metallic surface, said method comprising steps of:
   (a) immersing the substrate in an activation or wetting solution;
   (b) applying megasonic vibrations to the substrate; and after commencing step (b):
   (c) applying a turbulent flow of an electrolyte across the substrate, said electrolyte comprises metallic ions of said metal or alloy; and
   (d) applying an electroplating current density to the substrate;
   wherein a combination of the turbulent flow of the electrolyte and the current density produces void-free electrofilling of said metal or alloy inside the at least one opening;
   and wherein the activation or wetting solution is the same as the electrolyte.

3. The method of claim 2 wherein said steps (a) and (b) are performed in one chamber, and steps (c) and (d) are performed in another chamber.

4. The method of claim 2 wherein steps (a), (b), (c), and (d) are performed in the same electrochemical deposition (ECD) cell.

5. The method of claim 4 wherein the step of applying megasonic vibrations to the substrate is extended to coincide with at least a portion of steps (c) and (d), and wherein said step (d) comprises applying an electroplating current density in a range from about 20 mA/cm$^2$ to about 120 mA/cm$^2$ to the substrate.

6. A method for void-free electrofilling a metal or alloy inside at least one opening surrounded by a field on a front surface of a substrate, wherein at least one surface inside the at least one opening comprises an exposed metallic surface, said method comprising steps of:
   (a) immersing the substrate in an activation or wetting solution;
   (b) applying megasonic vibrations to the substrate; and after commencing step (b):
   (c) applying a turbulent flow of an electrolyte across the substrate, said electrolyte comprises metallic ions of said metal or alloy; and
   (d) applying an electroplating current density to the substrate;
   wherein a combination of the turbulent flow of the electrolyte and the current density produces void-free electrofilling of said metal or alloy inside the at least one opening;
   wherein the turbulent flow of the electrolyte is produced at least in part by high pressure jets of the electrolyte;
   wherein the activation or wetting solution is different than the electrolyte;
   and wherein steps (a), (b), (c), and (d) are performed in the same electrochemical deposition (ECD) cell, and said step (d) comprises applying an electroplating current density in a range from about 20 mA/cm$^2$ to about 120 mA/cm$^2$ to the substrate.

7. A method for void-free electrofilling a metal or alloy inside at least one opening surrounded by a field on a front surface of a substrate, wherein at least one surface inside the at least one opening comprises an exposed metallic surface, said method comprising steps of:
   (a) immersing the substrate in an activation or wetting solution;
   (b) applying megasonic vibrations to the substrate; and after commencing step (b):
   (c) applying a turbulent flow of an electrolyte across the substrate, said electrolyte comprises metallic ions of said metal or alloy; and
   (d) applying an electroplating current density to the substrate;
   wherein a combination of the turbulent flow of the electrolyte and the current density produces void-free electrofilling of said metal or alloy inside the at least one opening;
   wherein the turbulent flow of the electrolyte is produced at least in part by high pressure jets of the electrolyte;
   and wherein the activation or wetting solution is the same as the electrolyte.

8. The method of claim 7 wherein steps (a) and (b) are performed in one chamber, and steps (c) and (d) are performed in another chamber.

9. A method for void-free electrofilling a metal or alloy inside multiple openings surrounded by a field on a front surface of a substrate, wherein said multiple openings comprise at least one opening having a width from about 0.05 µm to about 20 µm, and/or at least one opening having a width from about 60 µm to about 200 µm, and wherein at least one surface inside each of the multiple openings comprises an exposed metallic surface, said method comprising steps of:
   (a) immersing the substrate in an activation or wetting solution;
   (b) applying megasonic vibrations to the substrate; and after commencing step (b):
   (c) applying high pressure jets of an electrolyte to the substrate, said electrolyte comprises metallic ions of said metal or alloy; and
   (d) applying an electroplating current density to the substrate;
   wherein a combination of the high pressure jets of the electrolyte and the current density produces void-free electrofilling of said metal or alloy inside the at least one opening having a width from about 0.05 µm to about 20 µm, and/or inside the at least one opening having a width from about 60 µm to about 200 µm;
   wherein the activation or wetting solution is different than the electrolyte;
   and wherein said steps (a), (b), (c), and (d) are performed in the same electrochemical deposition (ECD) cell.

10. A method for void-free electrofilling a metal or alloy inside multiple openings surrounded by a field on a front surface of a substrate, wherein said multiple openings comprise at least one opening having a width from about 0.05 pm to about 20 pm, and/or at least one opening having a width from about 60 pm to about 200 pm, and wherein at least one surface inside each of the multiple openings comprises an exposed metallic surface, said method comprising steps of:
    (a) immersing the substrate in an activation or wetting solution;
    (b) applying megasonic vibrations to the substrate; and after commencing step (b):
    (c) applying high pressure jets of an electrolyte to the substrate, said electrolyte comprises metallic ions of said metal or alloy; and
    (d) applying an electroplating current density to the substrate;
    wherein a combination of the high pressure jets of the electrolyte and the current density produces void-free electrofilling of said metal or alloy inside the at least one opening having a width from about 0.05 pm to about 20 pm, and/or inside the at least one opening having a width from about 60 pm to about 200 pm;
    wherein the activation or wetting solution is the same as the electrolyte.

11. The method of claim 10 wherein said steps (a) and (b) are performed in one chamber, and steps (c) and (d) are performed in another chamber.

12. The method of claim 10 wherein steps (a), (b), (c), and (d) are performed in the same electrochemical deposition (ECD) cell.

13. The method of claim 12 wherein the step of applying megasonic vibrations to the substrate is extended to coincide with at least a portion of the steps of applying high pressure jets of an electrolyte to the substrate, and applying an average electroplating current density to the substrate.

14. A method for void-free electrofilling a metal or alloy inside at least one opening surrounded by a field on a front surface of a substrate, wherein at least one surface inside the at least one opening comprises an exposed metallic surface, said method comprising steps of:
    (a) immersing the substrate in an activation or wetting solution;
    (b) applying megasonic vibrations to the substrate; and after commencing step (b):
    (c) applying a turbulent flow of an electrolyte across the substrate, said electrolyte comprises metallic ions of said metal or alloy; and
    (d) applying an electroplating current density to the substrate;

wherein a combination of the turbulent flow of the electrolyte and the current density produces void-free electrofilling of said metal or alloy inside the at least one opening;

wherein the activation or wetting solution is the same as the electrolyte;

and wherein said step (d) comprises applying an electroplating current density in a range from about 30 mA/cm$^2$ to about 120 mA/cm$^2$ to the substrate.

15. A method for void-free electrofilling a metal or alloy inside multiple openings surrounded by a field on a front surface of a substrate, wherein said multiple openings comprise at least one opening having a width from about 0.05 µm to about 20 µm, and/or at least one opening having a width from about 60 µm to about 200 µm, and wherein at least one surface inside each of the multiple openings comprises an exposed metallic surface, said method comprising steps of:

(a) immersing the substrate in an activation or wetting solution;

(b) applying megasonic vibrations to the substrate; and after commencing step (b):

(c) applying high pressure jets of an electrolyte to the substrate, said electrolyte comprises metallic ions of said metal or alloy; and (d) applying an electroplating current density to the substrate;

wherein a combination of the high pressure jets of the electrolyte and the current density produces void-free electrofilling of said metal or alloy inside the at least one opening having a width from about 0.05 µm to about 20 µm, and/or inside the at least one opening having a width from about 60 µm to about 200 µm, wherein the activation or wetting solution is the same as the electrolyte;

and wherein said step (d) comprises applying an electroplating current density in a range from about 30 mA/cm$^2$ to about 120 mA/cm$^2$ to the substrate.

* * * * *